(12) United States Patent
Telgenbüscher et al.

(10) Patent No.: US 9,230,829 B2
(45) Date of Patent: Jan. 5, 2016

(54) ADHESIVE COMPOUND AND METHOD FOR ENCAPSULATING AN ELECTRONIC ARRANGEMENT

(75) Inventors: Klaus Telgenbüscher, Hamburg (DE); Judith Grünauer, Hamburg (DE); Jan Ellinger, Hamburg (DE)

(73) Assignee: TESA SE, Hamburg (SE)

( * ) Notice: Subject to any disclaimer, the term of this patent is extended or adjusted under 35 U.S.C. 154(b) by 0 days.

(21) Appl. No.: 13/992,269

(22) PCT Filed: Nov. 3, 2011

(86) PCT No.: PCT/EP2011/069301
§ 371 (c)(1),
(2), (4) Date: Jun. 25, 2013

(87) PCT Pub. No.: WO2012/076262
PCT Pub. Date: Jun. 14, 2012

(65) Prior Publication Data
US 2013/0264724 A1    Oct. 10, 2013

(30) Foreign Application Priority Data
Dec. 10, 2010   (DE) .......................... 10 2010 062 823

(51) Int. Cl.
*H01L 21/56*   (2006.01)
*H01L 23/31*   (2006.01)
*H01L 51/52*   (2006.01)

(52) U.S. Cl.
CPC .............. *H01L 21/56* (2013.01); *H01L 21/561* (2013.01); *H01L 23/3121* (2013.01); *H01L 51/5253* (2013.01); *H01L 2924/0002* (2013.01); *H01L 2924/12044* (2013.01)

(58) Field of Classification Search
USPC ........... 257/100, E33.059, E21.001, E21.502, 257/E23.065; 438/15, 114; 118/50, 44; 427/294
See application file for complete search history.

(56) References Cited

U.S. PATENT DOCUMENTS 4,051,195 A    9/1977  McWhorter
4,552,604 A   11/1985  Green
(Continued)

FOREIGN PATENT DOCUMENTS

DE       37 37 945 C2     7/1992
DE      102 22 727 A1     9/2003
(Continued)

OTHER PUBLICATIONS

NASA, "U.S. Standard Atmosphere", 1976 report.*
(Continued)

*Primary Examiner* — Marvin Payen
*Assistant Examiner* — Victor Barzykin
(74) *Attorney, Agent, or Firm* — Norris McLaughlin & Marcus, P.A.

(57) ABSTRACT

The invention relates to a method for encapsulating an electronic arrangement against permeants, wherein an electronic arrangement is made available on a substrate, wherein, in a vacuum, that area of the substrate which embraces that region of the electronic arrangement which is to be encapsulated, preferably said area and that region of the electronic arrangement which is to be encapsulated, is brought into contact with a sheet material comprising at least one adhesive compound and a composite is produced therefrom. The invention also relates to an apparatus for implementing the method and to an encapsulated electronic arrangement produced thereby.

10 Claims, 5 Drawing Sheets

(56) References Cited

U.S. PATENT DOCUMENTS

| | | | |
|---|---|---|---|
| 5,904,488 A * | 5/1999 | Muramatsu | 438/15 |
| 6,455,172 B1 * | 9/2002 | Yano et al. | 428/607 |
| 2004/0225025 A1 | 11/2004 | Sullivan et al. | |
| 2006/0011288 A1 | 1/2006 | Watanabe et al. | |
| 2006/0100299 A1 | 5/2006 | Malik et al. | |
| 2007/0131274 A1 * | 6/2007 | Stollwerck et al. | 136/251 |
| 2007/0135552 A1 | 6/2007 | Wrosch et al. | |
| 2009/0093088 A1 | 4/2009 | Ano | |
| 2010/0068514 A1 | 3/2010 | Ellinger et al. | |

FOREIGN PATENT DOCUMENTS

| | | | |
|---|---|---|---|
| DE | 10 2005 060 456 A1 | 6/2007 | |
| DE | 10 2008 047 964 A1 | 3/2010 | |
| DE | 10 2008 060 113 A1 | 7/2010 | |
| EP | 1 475 424 A1 | 11/2004 | |
| EP | 1 956 063 A2 | 8/2008 | |
| EP | 2 166 593 A1 | 3/2010 | |
| GB | 1207824 | * | 10/1970 |
| JP | S 59 229310 A | 12/1984 | |
| JP | 2003 191328 A | 7/2003 | |
| JP | 2005 093963 A | 4/2005 | |
| JP | 2010074165 A | 4/2010 | |
| WO | 98 21287 A1 | 5/1998 | |
| WO | 02 26908 A1 | 4/2002 | |
| WO | 03 065470 A1 | 8/2003 | |
| WO | 2007 087281 A1 | 8/2007 | |
| WO | 2008 142934 A1 | 11/2008 | |
| WO | 2010 063579 A1 | 6/2010 | |

OTHER PUBLICATIONS

International Search Report mailed Jan. 25, 2012.
German Search Report issued in DE Application No. 10 2010 062 823.9 Dec. 10, 2010.
English translation of Office Action issued Sep. 14, 2015.

* cited by examiner

ADHESIVE COMPOUND AND METHOD FOR ENCAPSULATING AN ELECTRONIC ARRANGEMENT

This application is a 371 of International Application No. PCT/EP2011/069301, filed Nov. 3, 2011, which, in turn, claims priority of German Patent Application No. 10 2010 062 823.9, filed on Dec. 10, 2010, the entire contents of which patent applications are incorporated herein by reference.

The present invention relates to a method for the encapsulation of an electronic arrangement.

(Opto)electronic arrangements are being used with ever-increasing frequency in commercial products, or are close to market launch. Such arrangements comprise organic or inorganic electronic structures, such as organic, organometallic, or polymeric semiconductors, for example, or else combinations of these (referred to collectively below as organoelectronic arrangements). Depending on the desired application, these arrangements and products are made rigid or flexible, and there is increasing demand for flexible arrangements. The production of such arrangements is accomplished for example by means of printing techniques such as relief, gravure, screen, or planographic printing or else so-called non-impact printing such as thermal transfer printing, inkjet printing, or digital printing, for instance. In many cases, however, vacuum techniques are used as well, such as, for example, chemical vapor deposition (CVD), physical vapor deposition (PVD), plasma-enhanced chemical or physical deposition techniques (PECVD), sputtering, (plasma) etching, or vapor coating, with patterning taking place generally through masks.

In the text below, optoelectronic and organoelectronic arrangements are referred to collectively as electronic arrangements.

Examples of electronic applications that are already commercial or are of interest in terms of their market potential include electrophoretic or electrochromic constructions or displays, organic or polymeric light-emitting diodes (OLEDs or PLEDs) in readout and display devices, or as illumination, electroluminescent lamps, light-emitting electro-chemical cells (LEECs), organic solar cells, preferably dye or polymer solar cells, inorganic solar cells, preferably thin-film solar cells, based more particularly on silicon, germanium, copper, indium, and selenium, organic field-effect transistors, organic switching elements, organic optical amplifiers, organic laser diodes, organic or inorganic sensors, or else organic- or inorganic-based RFID transponders.

A perceived technical challenge for the realization of sufficient lifetime and function of (opto)electronic arrangements in the area of organic and/or inorganic (opto)electronics, and especially in the area of organic (opto)electronics, and also of inorganic thin-film solar cells, is the protection of the components they contain against permeants. Permeants may be a multiplicity of low molecular mass organic or inorganic compounds, more particularly water vapor and oxygen.

Permeation is understood as the process in which a substance (permeate) pervades or migrates through a solid body. The driving force is a concentration gradient. Permeability is tested by permeation measurement.

A multiplicity of (opto)electronic arrangements in the area of inorganic and/or organic (opto)electronics, especially where organic raw materials are used, are sensitive not only to water vapor but also to oxygen, and for numerous arrangements the penetration of water or water vapor is classed as a sizable problem. During the lifetime of the electronic arrangement, therefore, protection is necessary through encapsulation, since otherwise the performance subsides over the period of the application. For example, oxidation of the components, in the case of light-emitting arrangements such as electroluminescent lamps (EL lamps) or organic light-emitting diodes (OLEDs), for instance, may drastically reduce the luminosity, the contrast in the case of electrophoretic displays (EP displays), or the efficiency in the case of solar cells, within a very short time.

In organic and/or inorganic (opto)electronics, especially in organic (opto)electronics, there is a particular need for flexible bonding solutions which constitute a permeation barrier to permeants such as oxygen and/or water vapor. In addition there are a host of further requirements for such (opto)electronic arrangements. The flexible bonding solutions are therefore intended not only to achieve effective adhesion between two substrates, but also, in addition, to fulfill properties such as high shear strength and peel strength, chemical stability, aging resistance, high transparency, ease of processing, and also high flexibility and pliability.

One approach common in the prior art, therefore, is to place the electronic arrangement between two substrates that are impermeable to water vapor and oxygen. This is then followed by sealing at the edges. For nonflexible constructions, glass or metal substrates are used, which offer a high permeation barrier but are very susceptible to mechanical loads. Furthermore, these substrates give rise to a relatively high thickness of the arrangement as a whole. In the case of metal substrates, moreover, there is no transparency. For flexible arrangements, in contrast, sheetlike substrates are employed, such as transparent or nontransparent films, which may have a multi-ply configuration. In that case it is possible to use not only combinations of different polymers, but also organic or inorganic layers. The use of such sheetlike substrates allows a flexible, extremely thin construction. For the different applications there is a very wide variety of possible substrates, such as films, wovens, nonwovens, and papers, or combinations thereof, for example.

In order to obtain the most effective sealing, specific barrier adhesives are used. A good adhesive for the sealing of (opto) electronic components has a low permeability for oxygen, and particularly for water vapor, has sufficient adhesion to the arrangement, and is able to flow well onto the arrangement. Low adhesion to the arrangement reduces the barrier effect at the interface, so permitting the ingress of oxygen and water vapor independently of the properties of the adhesive. Only if the contact between adhesive and substrate is continuous are the properties of the adhesive the determining factor for the barrier effect of the adhesive.

For the purpose of characterizing the barrier effect it is usual to state the oxygen transmission rate OTR and the water vapor transmission rate WVTR. Each of these rates indicates the flow of oxygen or water vapor, respectively, through a film per unit area and unit time, under specific conditions of temperature and partial pressure and also, optionally, under further measurement conditions such as relative atmospheric humidity. The lower the values the more suitable the respective material for encapsulation. The statement of the permeation is not based solely on the values for WVTR or OTR, but instead also always includes an indication of the average path length of the permeation, such as the thickness of the material, for example, or a standardization to a defined path length.

The permeability P is a measure of the perviousness of a body for gases and/or liquids. A low P value denotes a good barrier effect. The permeability P is a specific value for a defined material and a defined permeant under steady-state conditions and with defined permeation path length, partial pressure, and temperature. The permeability P is the product of diffusion term D and solubility term S:

$P = D*S$

The solubility term S describes primarily the affinity of the barrier adhesive for the permeant. In the case of water vapor, for example, a low value for S is achieved by hydrophobic materials. Diffusion term D is a measure of the mobility of the permeant in the barrier material and is directly dependent on properties such as the molecular mobility or the free volume. Often, in the case of highly crosslinked or highly crystalline materials, relatively low values are obtained for D. Highly crystalline materials, however, are generally less transparent, and greater crosslinking results in a lower flexibility. The permeability P typically rises with an increase in the molecular mobility, as for instance when the temperature is raised or the glass transition point is exceeded.

Approaches at increasing the barrier effect of an adhesive must take particular account of the two parameters D and S, with a view to their influence on the permeability of water vapor and oxygen. In addition to these chemical properties, thought must also be given to consequences of physical effects on the permeability, particularly the average permeation path length and interface properties (flow-on behavior of the adhesive, adhesion). The ideal barrier adhesive has low D values and S values in conjunction with very good adhesion to the substrate.

A small solubility term S alone is usually not enough to achieve good barrier properties. One classic example of this, in particular, is siloxane elastomers. The materials are extremely hydrophobic (small solubility term), but as a result of their freely rotatable Si—O bond (large diffusion term) have a comparatively low barrier effect for water vapor and oxygen. For a good barrier effect, then, a good balance between solubility term S and diffusion term D is necessary.

For this purpose use has hitherto been made in particular of liquid adhesives and epoxide-based adhesives (WO 98/21287 A1; U.S. Pat. No. 4,051,195 A; U.S. Pat. No. 4,552,604 A). As a result of a high degree of crosslinking, these adhesives have a small diffusion term D. Their principal field of use is in the edge bonding of rigid arrangements, but also moderately flexible arrangements. Curing takes place thermally or by means of UV radiation. Full-area bonding is hard to achieve, owing to the contraction that occurs as a result of curing, since in the course of curing there are stresses between adhesive and substrate that may in turn lead to delamination.

The use of these liquid adhesives harbors a series of disadvantages. For instance, low molecular mass constituents (VOCs—volatile organic compounds) may damage the sensitive electronic structures in the arrangement and may hinder production operations. The adhesive must be applied, laboriously, to each individual constituent of the arrangement. The acquisition of expensive dispensers and fixing devices is necessary in order to ensure precise positioning. Moreover, the nature of application prevents a rapid continuous operation, and the laminating step that is subsequently needed may also make it more difficult, owing to the low viscosity, to achieve a defined layer thickness and bond width within narrow limits.

Furthermore, the residual flexibility of such highly crosslinked adhesives after curing is low. In the low temperature range or in the case of two-component systems, the use of thermally crosslinking systems is limited by the pot life, in other words the processing time until gelling has taken place. In the high temperature range, and particularly in the case of long reaction times, in turn, the sensitive (opto)electronic structures limit the possibility for use of such systems—the maximum temperatures that can be employed in the case of (opto)electronic structures are sometimes only 60° C., since above even this temperature there may be initial damage. Flexible arrangements which comprise organic electronics and are encapsulated using transparent polymer films or assemblies of polymer films and inorganic layers, in particular, have narrow limits here. The same applies to laminating steps under high pressure. In order to achieve improved durability, it is advantageous here to forgo a temperature exposure step and to carry out lamination under relatively low pressure.

As an alternative to the thermally curable liquid adhesives, radiation-curing adhesives are now also being used in many cases (US 2004/0225025 A1). The use of radiation-curing adhesives prevents long-lasting thermal load on the electronic arrangement. As a result of the irradiation, however, there is short-term pointwise heating of the arrangement, since, in general, not only UV radiation but also a very high fraction of IR radiation is emitted. Other aforementioned disadvantages of liquid adhesives, such as VOC, contraction, delamination, and low flexibility, are likewise retained. Problems may come about as a result of additional volatile constituents or elimination products from the photoinitiators or sensitizers. Moreover, the arrangement must be transparent to UV light.

Since constituents of organic electronics in particular, and many of the polymers used, are often sensitive to UV exposure, a long-lasting outdoor use is not possible without further, additional protective measures, such as further outer films, for instance. In the case of UV-curing adhesive systems, these films can be applied only after UV curing, thereby additionally increasing the complexity of the manufacture and the thickness of the arrangement.

US 2006/0100299 A1 discloses a UV-curable pressure-sensitive adhesive tape for encapsulating an electronic arrangement. The pressure-sensitive adhesive tape comprises an adhesive based on a combination of a polymer having a softening point of greater than 60° C., a polymerizable epoxy resin having a softening point of below 30° C., and a photoinitiator. The polymers may be polyurethane, polyisobutylene, polyacrylonitrile, polyvinylidene chloride, poly(meth)acrylate or polyester, but more particularly an acrylate. Additionally present are tackifier resins, plasticizers, or fillers.

Acrylate compositions have very good resistance to UV radiation and various chemicals, but possess very different bond strengths on different substrates. Whereas the bond strength on polar substrates such as glass or metal is very high, the bond strength on apolar substrates such as polyethylene or polypropylene, for example, tends to be low. Here there is a particular risk of diffusion at the interface. Moreover, these compositions are highly polar, which promotes diffusion, particularly of water vapor, in spite of subsequent crosslinking. This tendency is exacerbated by the use of polymerizable epoxy resins.

The pressure-sensitive adhesive embodiment specified in US 2006/0100299 A1 has the advantage of simplicity of application, but likewise suffers from possible elimination products as a result of the photoinitiators present, from mandatory UV transparency on the part of the construction, and from a reduction in flexibility after curing. Moreover, as a result of the small fraction of epoxy resins or other crosslinkers that is necessary to maintain the pressure-sensitive adhesion, and more particularly the cohesion, the crosslinking density achievable is very much lower than with liquid adhesives.

In contrast to liquid adhesives, and as a result of the relatively high molecular mass polymers, pressure-sensitive adhesive tapes generally require a certain time, sufficient pressure, and a good tradeoff between viscous component and elastic component, for good wetting and adhesion to the surface.

WO 2007/087281 A1 discloses a transparent, flexible, pressure-sensitive adhesive tape based on polyisobutylene (PIB) for electronics applications, especially OLEDs. It uses polyisobutylene having a molecular weight of more than 500 000 g/mol, and a hydrogenated cyclic resin. An optional possibility is the use of a photopolymerizable resin and a photoinitiator.

The low polarity of polyisobutylene-based adhesives gives them a good barrier to water vapor, and yet even at high molecular weights they have a relatively low cohesiveness, and hence frequently exhibit a low shear strength at elevated temperatures. The fraction of low molecular mass constituents cannot be reduced ad infinitum, since otherwise the adhesion is significantly reduced and there is an increase in the interface permeation. If a high fraction of functional resins is used, as is necessary on account of the very low cohesion of the adhesive, the polarity of the adhesive is increased again and hence the solubility term is enlarged.

Also described are barrier adhesives based on styrene block copolymers, as far as possible hydrogenated styrene block copolymers, and also correspondingly hydrogenated resins—in DE 10 2008 047 964 A1.

As a result of the formation of at least two domains within the block copolymer, very good cohesion at room temperature, and improved barrier properties at the same time, are additionally obtained.

Known from the prior art, furthermore, is a pressure-sensitive adhesive without barrier properties (WO 03/065470 A1) which is used as a transfer adhesive in an electronic assembly. The adhesive comprises a functional filler which reacts, within the assembly, with oxygen or water vapor. Accordingly, it is easy to apply a scavenger within the assembly. For the sealing of the assembly with respect to the outside, a further adhesive is used that has a low permeability.

The pressure-sensitive adhesives (PSAs) based on polyisobutylene share a significant disadvantage with their counterparts based on hydrogenated styrene block copolymers. In the case of bonding between two films provided with a barrier layer, as for example two PET films with an SiOx coating, of the kind that may be used for organic solar cells, for example, and on storage under hot and humid conditions, severe blistering occurs. Even the prior drying of the films and/or adhesive is unable to prevent this blistering. This behavior is especially disadvantageous in the case of PSAs laminated over the full area of an electronic arrangement, since as well as the deficient permeation barrier, optical defects occur.

It is an object of the present invention to specify an improved method for encapsulating an electronic arrangement against permeants, more particularly water vapor and oxygen, that does not damage the electronic arrangement, that can be integrated readily into existing manufacturing operations, and with which, at the same time, effective encapsulation is achieved. A further intention is to increase the lifetime of electronic arrangements, by producing a more impervious boundary layer in the encapsulated assembly, and also to reduce the risk of optical defects, especially in the case of a bond that is applied coveringly over the electronic arrangement.

This object is achieved by means of a method as described hereinbelow. Also described are advantageous embodiments and developments, and also apparatus for implementing the method of the invention.

The present invention accordingly provides in a first embodiment a method for encapsulating an electronic arrangement against permeants, in which an electronic arrangement is provided on a substrate, where, in a vacuum, the area of the substrate including the region of the electronic arrangement that is to be encapsulated, preferably this area and the region of the electronic arrangement that is to be encapsulated, is contacted with a sheetlike structure comprising at least one adhesive, and an assembly is produced, preferably by lamination.

It is not necessary here for the entire electronic arrangement to be located in a vacuum. It is sufficient for said arrangement to be present partially in a vacuum at least in the region in which the contact and the lamination actually take place.

The adhesive is preferably a pressure-sensitive adhesive, i.e., a viscoelastic adhesive which remains permanently tacky and adhesive in the dry state at room temperature. Adhesive bonding is accomplished by gentle applied pressure, instantaneously, to virtually all substrates.

The adhesive may alternatively be a hotmelt adhesive, in other words a substantially water-free and solvent-free adhesive which is solid at room temperature and which is contacted in the melt with the parts that are to be bonded, and, following the assembly of the parts, sets physically on cooling, with solidification. A hotmelt adhesive is preferably completely water-free and solvent-free.

A vacuum for the purposes of the invention means a reduced ambient pressure of less than or equal to 800 mbar. It is preferred to use a pressure of less than 200 mbar, more particularly of less than 50 mbar, since in these cases particularly good quality of lamination can be achieved.

A pressure of between 100 and 200 mbar is especially advantageous, since within this range there is a good tradeoff between good quality of lamination and the technical cost and effort involved in producing and maintaining the vacuum.

An inventively "higher pressure range", of between 700 and 800 mbar, for example, has the advantage that the technical cost and effort involved in generating the reduced pressure can be kept low.

In a further advantageous embodiment, the vacuum is generated by raising the geographical height of the site of lamination. A height of between 3000 and 4000 m above sea level is preferred, since here there is a sufficient number of production sites with infrastructure, and, moreover, living conditions for people are comfortable. Examples would include cities such as La Paz (Bolivia) and Lhasa (China).

Surprisingly, a calcium mirror encapsulated by the method of the invention, which as a component in a test method simulates the lifetime of an electronic component, has a higher lifetime than an assembly laminated together under high pressure—that is, under a multiple of atmospheric pressure, and hence not in a vacuum. There are no differences in the laminates in terms of optical quality—for both constructions, no blisters are apparent even under the microscope.

In contrast to known vacuum lamination techniques, in which first of all the assembly of plies is constructed under atmospheric pressure and is thereafter introduced, in the laminated state, into the vacuum, the application of vacuum here takes place before the layers are led together. This has the advantage that, particularly when using pressure-sensitive adhesives, no gas bubbles are included even at the inevitable contact points in the conventional method.

The method is additionally advantageous in combination with other vacuum techniques which are used, for instance, for producing electronic constructions, as for example when utilizing small molecules as active layers or utilizing vapor-applied metals or metal compounds in such constructions. With the method of the invention, such constructions can be encapsulated directly in the operating vacuum, without the need for air to be admitted in between.

Surprisingly it has been found that through the method of the invention it is possible to prevent blistering under hot and humid conditions, despite the fact that in the comparative example, with lamination under atmospheric pressure and also high laminating pressure (the laminating pressure here was considerably higher than the atmospheric pressure), such blistering did indeed occur, even if no blisters were perceptible under the microscope. Surprisingly, therefore, the effect of the vacuum cannot be compensated by increased laminating pressure.

In one advantageous embodiment of the method, the vacuum is produced not in a closed-off chamber, but instead only partially on the electronic arrangement and/or on the substrate, as for example in the nip in a roll lamination. For this purpose, for example, a vacuum box (vacuum shaft) can be used, of the kind used in flat-film extrusion technology for applying extruded films to the chill roll (see, for example, the book "Technologie der Extrusion" by Helmut Greif, Carl Hanser Verlag, 2004). Accordingly, the vacuum is generated only on a line. An advantage here is the low level of technical cost and complexity involved in local provision of a vacuum. Surprisingly it has been found that this vacuum is already enough to improve the quality of encapsulation and to prevent blistering of the adhesives under hot and humid conditions.

In a further advantageous embodiment of the method, the vacuum lamination is carried out as part of a roll-to-roll process. In this case, the electronic arrangement is provided on the substrate as a web material, which may then, for example, constitute a multiplicity of individual electronic arrangements. The pressure-sensitively adhesive or hotmelt-adhesive sheetlike structure as well is advantageously provided as a web material, such as a homogeneous sheet material or individual diecuts disposed on a carrier substrate in web form. Vacuum lamination then takes place continuously. It may take place, for example, in a vacuum chamber within which feed rollers and take-off rollers are arranged, or which is provided with corresponding locks for the entry and exit of the web materials. Advantageous for this purpose, however, is the partial generation of vacuum, by means of a vacuum box, for example. Advantageous features associated with the use of a roll-to-roll process are the higher productivity and the greater economics of such continuous processes.

Also particularly advantageous is the use of a roll lamination procedure in which at least one roll applies a force for producing the assembly. The opposing force may then be applied, for example, by a planar plate, by a belt, or by a further roll. An advantage of this embodiment is that any quantities of residual gas still present are expelled in a targeted way in one direction, thereby improving the quality of the assembly.

One particularly advantageous embodiment uses two laminating rolls.

The preferred laminating force along the contact line of roll and counterpart is dependent on the adhesive used and in the case of a roll laminating procedure is between 0.5 and 100 N/cm. Particularly in the case of pressure-sensitive adhesives, a range from 5 to 50 N/cm is preferred, since the high pressure improves fluid application. In the case of hotmelt adhesives, a range from 0.5 N/cm to 2 N/cm is preferred, since within this range the risk of uncontrolled runoff of the adhesive is reduced.

In general a laminating pressure of 0.01 MPa to 5 MPa is preferred. In the case of PSAs, a range of 0.5 MPa to 5 MPa is preferred, since the high pressure improves fluid application. In the case of thermoplastic hotmelt adhesives, a range from 0.01 MPa to 0.5 MPa is preferred, since in this case the risk of uncontrolled runoff of the adhesive is reduced.

In order to achieve a very low air pressure even in the case of partial generation of vacuum, it is advantageous to use apparatus combining vacuum box and laminating rolls.

One such apparatus is shown by way of example in FIG. 3 and is hereby claimed as inventive.

The apparatus is optimized for optimum sealing. At the entry of the electronic arrangement 2, provided on a web substrate 1, and of the pressure-sensitively adhesive or hotmelt-adhesive sheetlike structure 3 in web form, sealing is undertaken by co-rotating rolls 7, which in turn, within the interior of the vacuum box 6, are sealed by contact seals or by minimized nip dimensions. At the exit, the laminating nip between the laminating rolls 4 and 41 themselves serves as a seal.

In one advantageous embodiment, the sealing and/or laminating rolls are manufactured from an elastomer or are provided with an elastomer covering. This permits effective contact with the surfaces to be sealed. On their surface at room temperature the rolls preferably have a Shore A hardness of less than 50 (DIN 53505—A, test time 3 s). This enables the roll surfaces to effect elastic compensation of the thickness of incoming or outgoing sheetlike structures and also to achieve sufficient sealing even in the edge regions where the web no longer covers the roll.

In one preferred embodiment, at least one roll has abhesive properties. For the case where a PSA is used, this is advantageous so that the adhesive does not stick to the rolls with which it comes into contact. The abhesive material used may be, for example, silicone elastomer.

The side faces of the vacuum box, covering the laminating rolls 4 and 41, are sealed with respect to these rolls by means of minimized nip dimensions or contact seals. As for the sealing rolls 7, nip dimensions below 0.1 mm are advantageous here, more particularly below 0.01 mm, since greater imperviousness is achieved in this way. Nip dimensions within this range can be achieved by very narrow manufacturing tolerances or by utilizing the differences in lengthwise extent through targeted heating of the apparatus, this heating differing in different regions. It is also possible to use seals which are at least partly open by the external air pressure and are kept open by the resultant air flow into the interior of the vacuum box. Such seals may be configured, for example, as sealing lips curved into the interior of the vacuum box. Depending on the flexural stiffness of the sealing lip, a nip of greater or lesser size is formed by the inflowing atmosphere.

If the sealing is implemented by means of contact seals, it is advantageous for the surface of these seals to possess a low coefficient of friction relative to the roll material, so that the force needed for the rolls to rotate can be minimized. This is especially advantageous where the seals are configured as outwardly curved sealing lips, since these lips are pressed against the sealing surface by the air pressure.

The sealing systems described or those known to the skilled person may also be implemented in combinations.

Permeants in the sense of the present specification are those chemical substances (for example, atoms, ions, molecules, etc.) which may penetrate into an arrangement or a component, more particularly an electronic or electronic arrangement or a corresponding component, where they may in particular cause functional disruptions. The penetration may take place, for example, through the housing or through the encasement itself, but also, in particular, through openings in the housing or the encasement, or through seams, bonding points, welding points, or the like. The housing or encasement in this sense is understood to refer to the components which entirely or partly surround the sensitive components and which, in addition to their mechanical function, are intended in particular to protect said sensitive components.

Permeants in the sense of the present specification are, in particular, organic or inorganic compounds of low molecular mass, as for example hydrogen ($H_2$), especially oxygen ($O_2$) and water ($H_2O$). The permeants may in particular be in gas or vapor form. Reference is hereby made to the remarks in the introductory section of this application.

The present invention is based initially on the finding that in spite of the above-described disadvantages it is nevertheless possible, through the method of the invention, to encapsulate an electronic arrangement even using a pressure-sensitive adhesive where the disadvantages described above for PSAs occur. This group of adhesives hitherto hampered by disadvantages embraces, in particular, pressure-sensitive adhesives and hotmelt adhesives which in the chemically uncrosslinked state have a Shear Adhesion Failure Temperature (SAFT) of less than 100° C. They include, in particular, PSAs based on polyisobutylene (PIB), of the kind described in WO 2007/087281 A1 or in DE 10 2008 060 113 A1, for example; block copolymers comprising polymer blocks predominantly formed of vinylaromatics (A blocks) and those predominantly formed by polymerization of 1,3-dienes (B blocks); and semicrystalline polyolefins, of the kind described in DE 10 2008 047 964 A1, for example.

With further preference the electronic arrangement on the substrate is surrounded entirely by the sheetlike structure, and so the sheetlike structure covers at least one side—the top side, for example—and also the four narrow sides of the electronic arrangement. In this way there is no cavity formed between the electronic arrangement and the sheetlike structure, and this implies, for example, a lower loss of light as a result of unwanted refraction. Through the method of the invention it becomes possible also to use those pressure-sensitive adhesives and hotmelt adhesives which in the case of complete enclosure in particular would exhibit very adverse optical defects in the blister test.

When using a sheetlike structure which encloses the electronic arrangement it is inevitable that said sheetlike structure is not laminated on until after the electronic arrangement has been completed on the substrate. However, even in the case of use of a sheetlike element which surrounds the electronic construction in the form of a frame, and is supplied as a diecut, it is advantageous first to produce the electronic construction in full, so that the adhesive is not damaged or contaminated by further manufacturing operations that take place between lamination and the application of a cover that finally closes the encapsulation, such as by radiation, plasmas, thermal energy, or (chemically reactive) substances that are used.

It is especially advantageous for the encapsulation of (opto)electronic constructions if the pressure-sensitive adhesive in the method of the invention is heated during or after application. In this way the pressure-sensitive adhesive is able to flow on more effectively and hence the permeation at the interface between the (opto)electronic arrangement or its substrate and the PSA can be reduced. The temperature here ought preferably to be more than 30° C., more preferably more than 50° C., in order to promote fluid application accordingly. The temperature, however, should not be selected at too high a level, so as not to damage the (opto) electronic arrangement. The temperature ought as far as possible to be less than 120° C. Temperatures between 50° C. and 100° C. have emerged as an optimum temperature range. If corresponding local heating methods such as, for example, ultrasonic heating or induction heating are able to prevent the excessive heating of the electronic construction, then higher temperatures, such as up to 250° C., are also advantageous, since crosslinking reactions, for the purpose of increasing the permeation barrier, for example, are more easily implemented at higher temperatures.

In a preferred embodiment of a method for encapsulating an electronic arrangement against permeants, the hotmelt adhesive or pressure-sensitive adhesive can be provided in the form of an adhesive tape. This form of presentation permits particularly simple and uniform application of the adhesive.

The general expression "sheetlike structure" or "adhesive tape" here encompasses, in one embodiment, a carrier material which is provided on one or both sides with a pressure-sensitive adhesive. The carrier material encompasses all sheetlike structures, examples being two-dimensionally extended films or film sections, tapes with extended length and limited width, tape sections, diecuts, multilayer arrangements, and the like. Furthermore, the expression "sheetlike structure" or "adhesive tape" also embraces what are called "adhesive transfer tapes", i.e., an adhesive tape without carrier. In the case of an adhesive transfer tape, for example, the pressure-sensitive adhesive is applied prior to application to a flexible liner or between flexible liners which have been provided with a release coat and/or have antiadhesive properties. For application, the first liner—if present—is first removed, the adhesive is applied, and then the second liner is removed. In this way the PSA can be used directly to join two surfaces in (opto)electronic arrangements. In the case of a hotmelt adhesive, the adhesive transfer tape may for example comprise only the hotmelt adhesive itself or else one or two additional liners as well.

For different applications of the adhesive tape it is possible here to combine a very wide variety of carriers such as, for example, films, woven fabrics, nonwoven fabrics, and papers with the adhesives. As carrier material for an adhesive tape it is preferred in the present context to use polymer films, film composites, or films or film composites that have been provided with organic and/or inorganic layers. Such films/film composites may be composed of any common plastics used for film manufacture, with nonrestricting examples that may be mentioned including the following: polyethylene, polypropylene, more particularly the oriented polypropylene (OPP) produced by monoaxial or biaxial stretching, cyclic olefin copolymers (COC), polyvinyl chloride (PVC), polyesters, especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyethersulfone (PES), or polyimide (PI).

The carrier, moreover, may be combined with organic or inorganic coatings or layers. This can be done by customary techniques, such as surface coating, printing, vapor coating, sputtering, coextruding or laminating, for example. Examples—though without restriction—here include, for instance, oxides or nitrides of silicon and of aluminum, indium-tin oxide (ITO) or sol-gel coatings.

With particular preference these films/film composites, especially the polymer films, are provided with a permeation barrier for oxygen and water vapor, the permeation barrier exceeding the requirements for the packaging sector (WVTR<$10^{-1}$ g/($m^2$d); OTR<$10^{-1}$ $cm^3$/($m^2$d bar)). The permeability for oxygen (OTR) and water vapor (WVTR) is determined in accordance with DIN 53380 part 3 and ASTM F-1249, respectively. The oxygen permeability is measured at 23° C. and a relative humidity of 50%. The water vapor permeability is determined at 37.5° C. and a relative humidity of 90%. The results are standardized for a film thickness of 50 μm.

In a preferred embodiment, moreover, the films/film composites may be transparent in form, so that the overall construction of such an adhesive article is also transparent in form. "Transparency" here denotes an average transmittance in the visible region of light of at least 75%, preferably higher than 90%.

In the pressure-sensitive adhesive tape embodiment with carrier, the maximum transmittance of the overall construction is dependent, moreover, on the nature of the carrier used and on the nature of the construction.

According to the requirements of the electronic arrangement, it is possible in one particular embodiment of the method for the elastic and viscous properties, and also the barrier effect, of the hotmelt adhesive or PSA to be additionally varied by means of a subsequent crosslinking step. In a form adapted to the electronic arrangement, this may take place both thermally and by means of electromagnetic radiation, but preferably by means of UV radiation, electron radiation or gamma radiation. Hence it is possible for both the barrier effect and the adhesive strength to be increased following introduction into the electronic construction. At the same time, however, the high flexibility of the hotmelt adhesive or PSA is preferably retained.

With further preference a hotmelt adhesive or PSA is employed which in certain embodiments is transparent in the visible light of the spectrum (wavelength range from about 400 nm to 800 nm). For certain applications, for instance in the case of solar cells, however, this range may also be extended to defined UV or IR regions. The desired transparency in the preferred region of the visible spectrum can be achieved in particular through the use of colorless tackifier resins. A PSA of this kind is therefore also suitable for full-area use over an electronic structure. Full-area bonding, in the case of an approximately central disposition of the electronic structure, in contrast to edge sealing, offers the advantage that the permeant would have to diffuse through the entire area before reaching the structure. The permeation pathway is therefore significantly increased. The prolonged permeation pathways in this embodiment, in comparison to edge sealing by means of liquid adhesives, for instance, have positive consequences for the overall barrier, since the permeation pathway is in inverse proportion to the permeability.

Adhesives used are preferably those based on block copolymers comprising polymer blocks predominantly formed of vinylaromatics (A blocks), preferably styrene, and those predominantly formed by polymerization of 1,3-dienes (B blocks), preferably butadiene, isoprene or a mixture of both monomers. These B blocks typically have a low polarity. Both homopolymer and copolymer blocks can be utilized with preference as B blocks.

The block copolymers resulting from the A and B blocks may comprise the same or different B blocks, which may have been partly, selectively or fully hydrogenated. The block copolymers may have linear A-B-A structures. It is likewise possible to employ block copolymers of radial architecture, and also star-shaped and linear multiblock copolymers. Further components present may include A-B diblock copolymers. Block copolymers of vinylaromatics and isobutylene are likewise suitable for application in accordance with the invention. All of the aforementioned polymers may be utilized alone or in a mixture with one another.

It is also possible to use block copolymers which in addition to the above-described blocks A and B comprise at least one further block, such as A-B-C block copolymers, for example.

Also conceivable is the use of the abovementioned B blocks with A blocks of different chemical nature, which have a glass transition temperature above room temperature, such as polymethyl methacrylate, for example.

In one advantageous embodiment the block copolymers have a polyvinylaromatic fraction of 10% to 35% by weight.

In another preferred embodiment the fraction of the vinylaromatic block copolymers in total, based on the overall PSA, is at least 30%, preferably at least 40% and more preferably at least 45% by weight. A result of an inadequate fraction of vinylaromatic block copolymers is that the cohesion of the PSA is relatively low. The maximum fraction of the vinylaromatic block copolymers in total, based on the overall PSA, is not more than 80% by weight, preferably not more than 70% by weight. Too high a fraction of vinylaromatic block copolymers has the consequence in turn that the PSA is barely still tacky.

At least some of the block copolymers used are acid-modified or acid anhydride-modified, the modification being accomplished principally by means of radical graft copolymerization of unsaturated monocarboxylic and polycarboxylic acids or anhydrides, such as fumaric acid, itaconic acid, citraconic acid, acrylic acid, maleic anhydride, itaconic anhydride or citraconic anhydride, preferably maleic anhydride. The fraction of acid or acid anhydride is preferably between 0.5 and 4 percent by weight, based on the overall block copolymer.

The crosslinking of these elastomers may take place in a variety of ways. On the one hand, the acid or acid anhydride groups may be reacted with crosslinkers, such as various amines or epoxy resins, for example.

Amines employed may be primary and secondary amines or else amides and other nitrogen-containing compounds like those with a hydrogen directly bonded on the nitrogen.

Epoxy resins are usually taken to be both monomeric and oligomeric compounds having more than one epoxide group per molecule. They may be reaction products of glycidyl esters or epichlorohydrin with bisphenol A or bisphenol F or mixtures of these two. It is likewise possible to employ epoxy novolak resins obtained by reacting epichlorohydrin with the reaction product of phenols and formaldehyde. Monomeric compounds having two or more terminal epoxide groups, which are used as diluents for epoxy resins, can also be employed. It is likewise possible to employ elastically modified epoxy resins or epoxide-modified elastomers such as, for example, epoxidized styrene block copolymers, an example being Epofriend from Daicel.

Examples of epoxy resins are Araldite™ 6010, CY-281™, ECN™ 1273, ECN™ 1280, MY 720, RD-2 from Ciba Geigy, DER™ 331, 732, 736, DEN™ 432 from Dow Chemicals, Epon™ 812, 825, 826, 828, 830 etc. from Shell Chemicals, HPT™ 1071, 1079, likewise from Shell Chemicals, and Bakelite™ EPR 161, 166, 172, 191, 194 etc. from Bakelite AG.

Examples of commercial aliphatic epoxy resins are vinylcyclohexane dioxides such as ERL-4206, 4221, 4201, 4289 or 0400 from Union Carbide Corp.

Elastified elastomers are available from Noveon under the Hycar name.

Epoxide diluents, monomeric compounds having two or more epoxide groups, are, for example, Bakelite™, EPD KR, EPD Z8, EPD HD, EPD WF, etc. from Bakelite AG or Polypox™ R 9, R12, R 15, R 19, R 20 etc. from UCCP.

In these reactions an accelerant is typically used as well. This accelerant may come from the group, for example, of the tertiary amines or modified phosphines, such as triphenylphosphine, for example.

Whereas the reaction with the amines takes place frequently even at room temperature, the crosslinking with the epoxy resins generally proceeds at an elevated temperature.

The second possibility of crosslinking takes place via metal chelates. Crosslinking of maleic anhydride-modified block copolymers with metal chelates is known from EP 1 311 559 B1, where an increase in the cohesion of the block copolymer mixtures is described. There is no mention, however, of use in (opto)electronic constructions.

The metals of the metal chelates may be from main groups 2, 3, 4, and 5 and the transition metals. Particular suitability is possessed for example by aluminum, tin, titanium, zirconium, hafnium, vanadium, niobium, chromium, manganese, iron, cobalt, and cerium. Aluminum and titanium are particularly preferred.

For the chelate crosslinking it is possible for various metal chelates to be employed, which may be represented by the following formula:

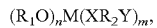

$(R_1O)_n M(XR_2Y)_m$, where

M is a metal as described above;

$R_1$ is an alkyl or aryl group such as methyl, ethyl, butyl, isopropyl or benzyl;

n is zero or a larger integer,

X and Y are oxygen or nitrogen, and may in each case also be bonded to $R_2$ by a double bond;

$R_2$ is an alkylene group which joins X and Y and may be branched, or else may comprise oxygen or other heteroatoms in the chain;

m is an integer, but is at least 1.

Preferred chelate ligands are those resulting from the reaction of the following compounds: triethanolamine, 2,4-pentanedione, 2-ethyl-1,3-hexanediol or lactic acid. Particularly preferred crosslinkers are aluminum acetylacetonates and titanyl acetylacetonates.

The ratio selected between the acid and/or acid anhydride groups and the acetylacetonate groups here ought to be approximately equivalent in order to achieve optimum crosslinking, and a small excess of crosslinker has proved to be positive. However, the ratio between anhydride groups and acetylacetonate groups can be varied, in which case, for sufficient crosslinking, neither of the two groups should be present in more than a five-fold molar excess.

Surprisingly, PSAs comprising chelate-crosslinked, acid- or acid anhydride-modified vinylaromatic block copolymers also exhibit very low water vapor and oxygen permeability. This is unexpected of a PSA having such polar constituents as acid anhydrides and metal chelates.

In a further-preferred embodiment the PSA, in addition to the at least one vinylaromatic block copolymer, comprises at least one tackifier resin in order to increase the adhesion in a desired way. The tackifier resin ought to be compatible with the elastomer block of the block copolymers.

As tackifiers in the PSA it is possible to use, for example, unhydrogenated, partially hydrogenated or fully hydrogenated resins based on rosin and rosin derivatives, hydrogenated polymers of dicyclopentadiene, non-, partially, selectively or fully hydrogenated hydrocarbon resins based on $C_5$, $C_5/C_9$ or $C_9$ monomer streams, polyterpene resins based on α-pinene and/or β-pinene and/or δ-limonene, hydrogenated polymers of preferably pure $C_8$ and $C_9$ aromatics. Aforementioned tackifier resins may be used both alone and in a mixture. Both resins which are solid at room temperature and liquid resins may be employed. In order to ensure high aging stability and UV stability, preference is given to hydrogenated resins having a degree of hydrogenation of at least 90%, preferably of at least 95%.

Preference is given, furthermore, to apolar resins having a DACP (diacetone alcohol cloud point) of more than 30° C. and an MMAP (mixed methylcyclohexane aniline point) of greater than 50° C., more particularly having a DACP of more than 37° C. and an MMAP of more than 60° C. The DACP and the MMAP values each indicate the solubility in a particular solvent (for DACP, a solvent mixture of 1:1 parts by weight of xylene and 4-hydroxy-4-methyl-2-pentanone; and, for MMAP, a solvent mixture of 1:2 parts by weight of methylcyclohexane and aniline). The selection of these ranges produces a particularly high permeation barrier, particularly with respect to water vapor.

Further preference is given to resins having a softening temperature (ring and ball; determined as per DIN EN ISO 4625) of more than 95° C., in particular more than 100° C. This selection provides a particularly high permeation barrier, particularly with respect to oxygen. The softening point is understood as the temperature (or temperature range) at which glasses, amorphous or semicrystalline polymers undergo a transition from the hard-elastic, glassy state to a soft state. The reduction in hardness of such substances at the softening point becomes apparent, for example, from the fact that a body mounted under load onto a sample of substance is pressed into that substance when the softening point has been reached. The softening point is in principle above the glass transition temperature, but for the majority of polymers is well below the temperature at which the polymers undergo complete transition into the liquid state.

If the aim is to achieve an increase in bond strength, on the other hand, resins having a softening temperature of below 95° C., more particularly below 90° C., are especially preferred.

Other additives which can typically be utilized include the following:

plasticizers such as, for example, plasticizer oils, or low molecular mass liquid polymers, such as low molecular mass polybutenes, for example primary antioxidants, such as, for example, sterically hindered phenols secondary antioxidants, such as, for example, phosphites or thioethers in-process stabilizers, such as C radical scavengers, for example light stabilizers, such as, for example, UV absorbers or sterically hindered amines processing assistants endblock reinforcer resins, and optionally further polymers of preferably elastomeric kind; elastomers which can be utilized accordingly include, among others, those based on pure hydrocarbons, for example unsaturated polydienes such as natural or synthetically produced polyisoprene or polybutadiene, chemically substantially saturated elastomers such as, for example, saturated ethylene-propylene copolymers, α-olefin copolymers, polyisobutylene, butyl rubber, ethylene-propylene rubber, and also chemically functionalized hydrocarbons such as, for example, polyolefins containing halogen, acrylate, allyl or vinyl ether.

In one embodiment of the present invention the PSA also comprises fillers; examples that may be mentioned, though without restriction, include oxides, hydroxides, carbonates, nitrides, halides, carbides or mixed oxide/hydroxide/halide compounds of aluminum, silicon, zirconium, titanium, tin, zinc or iron or of the alkali metals or alkaline earth metals.

These fillers are, essentially, clay earths, examples being aluminum oxides, boehmite, bayerite, gibbsite, diaspore and the like. Especially suitable are phyllosilicates such as, for example, bentonite, montmorillonite, hydrotalcite, hectorite, kaolinite, boehmite, mica, vermiculite or mixtures thereof. It is also possible, however, to use carbon blacks or other modifications of carbon, such as carbon nanotubes.

Besides the preferred adhesives based on vinylaromatic block copolymers, it is also possible for adhesives known to the skilled person and based on polyisobutylene, polyolefins, polyamides, polyesters, and polyurethanes to be used.

One further preferred adhesive group is formed by the heat-activatable adhesives.

As the at least one heat-activatedly bonding adhesive it is possible in principle to employ all customary heat-activatedly bonding adhesive systems. Heat-activatedly bonding adhesives can be divided in principle into two categories: thermoplastic heat-activatedly bonding adhesives (hotmelt adhesives), and reactive heat-activatedly bonding adhesives (reactive adhesives). This subdivision also includes those adhesives which can be assigned to both categories, namely reactive thermoplastic heat-activatedly bonding adhesives (reactive hotmelt adhesives).

Thermoplastic adhesives are based on polymers which soften reversibly on heating and solidify again in the course of cooling. In contrast to these, reactive heat-activatedly bonding adhesives comprise reactive components. The latter constituents are also referred to as "reactive resins", in which heating initiates a crosslinking process which, after the end of the crosslinking reaction, ensures a permanent stable bond even under pressure. Thermoplastic adhesives of this kind preferably also comprise elastic components, examples being synthetic nitrile rubbers. Such elastic components give the heat-activatedly bonding adhesive a particularly high dimensional stability even under pressure, on account of their high flow viscosity.

Described below, purely by way of example, are a number of typical systems of heat-activatedly bonding adhesives which have emerged as being particularly advantageous in connection with the present invention.

A thermoplastic heat-activatedly bonding adhesive, then, comprises a thermoplastic base polymer. This polymer has good flow behavior even under low applied pressure, and so the ultimate bond strength that is relevant for the durability of a permanent bond comes about within a short applied-pressure time, and, therefore, rapid bonding is possible even to a rough or otherwise critical substrate. As thermoplastic heat-activatedly bonding adhesives it is possible to use all of the thermoplastic adhesives known from the prior art.

Exemplary compositions are described in EP 1 475 424 A1, for instance. Hence the thermoplastic adhesive may comprise, or even consist of, for example, one or more of the following components: polyolefins, ethylene-vinyl acetate copolymers, ethylene-ethyl acrylate copolymers, polyamides, polyesters, polyurethanes or butadiene-styrene block copolymers. Further thermoplastic adhesives particularly suitable especially for specific fields of use such as the bonding of glass bond substrates, for example, are described in EP 1 956 063 A2. It is preferred to use thermoplastic adhesives whose melt viscosity has been raised by rheological additives, as for example through addition of fumed silicas, carbon black, carbon nanotubes and/or further polymers as blend components.

A reactive heat-activatedly bonding adhesive, in contrast, advantageously comprises an elastomeric base polymer and a modifier resin, the modifier resin comprising a tackifier resin and/or a reactive resin. Through the use of an elastomeric base polymer it is possible to obtain adhesive layers having outstanding dimensional stability. As reactive heat-activatedly bonding adhesives it is possible, in line with the specific applications in each case, to use all of the heat-activatedly bonding adhesives that are known from the prior art.

Also included here, for example, are reactive heat-activatedly bonding films based on nitrile rubbers or derivatives thereof such as, for instance, nitrile-butadiene rubbers or mixtures (blends) of these base polymers, additionally comprising reactive resins such as phenolic resins, for instance; one such product is available commercially under the name tesa 8401, for instance. On account of its high flow viscosity, the nitrile rubber gives the heat-activatedly bonding film a pronounced dimensional stability, allowing high bond strengths to be realized on plastics surfaces after a crosslinking reaction has been carried out.

Naturally, other reactive heat-activatedly bonding adhesives can be used as well, such as, for instance, adhesives comprising a mass fraction of 50% to 95% by weight of a bondable polymer and a mass fraction of 5% to 50% by weight of an epoxy resin or a mixture of two or more epoxy resins. The bondable polymer in this case comprises advantageously 40% to 94% by weight of acrylic acid compounds and/or methacrylic acid compounds of the general formula $CH_2=C(R^1)(COOR^2)$ ($R^1$ here represents a radical selected from the group encompassing H and $CH_3$, and $R^2$ represents a radical selected from the group encompassing H and linear or branched alkyl chains having 1 to 30 carbon atoms), 5% to 30% by weight of a first copolymerizable vinyl monomer which has at least one acid group, more particularly a carboxylic acid group and/or sulfonic acid group and/or phosphonic acid group, 1% to 10% by weight of a second copolymerizable vinyl monomer which has at least one epoxide group or an acid anhydride function, and 0% to 20% by weight of a third copolymerizable vinyl monomer which has at least one functional group different from the functional group of the first copolymerizable vinyl monomer and from the functional group of the second copolymerizable vinyl monomer. An adhesive of this kind allows bonding with rapid activation, the ultimate bond strength being achieved within just a short time, with the result, overall, that an effectively adhering connection to an apolar substrate is ensured.

A further reactive heat-activatedly bonding adhesive which can be used, and which affords particular advantages, comprises 40% to 98% by weight of an acrylate-containing block copolymer, 2% to 50% by weight of a resin component, and 0% to 10% by weight of a hardener component. The resin component comprises one or more resins selected from the group encompassing bond strength enhancing (tackifying) epoxy resins, novolak resins, and phenolic resins. The hardener component is used for crosslinking the resins from the resin component. On account of the strong physical crosslinking within the polymer, a formulation of this kind affords the particular advantage that adhesive layers having a great overall thickness can be obtained, without detriment overall to the robustness of the bond. As a result, these adhesive layers are particularly suitable for compensating unevennesses in the substrate. Moreover, an adhesive of this kind features good aging resistance and exhibits only a low level of outgassing, a particularly desirable feature for many bonds in the electronics segment.

As fillers of the PSA it is preferred to use nanoscale and/or transparent fillers. In the present context a filler is termed nanoscale if in at least one dimension it has a maximum extent of about 100 nm, preferably of about 10 nm. Particular preference is given to using those fillers which are transparent in the adhesive and have a platelet-shaped crystallite structure and a high aspect ratio with homogeneous distribution. The fillers with a platelet-like crystallite structure and aspect ratios well above 100 generally have a thickness of just a few nm, although the length and/or width of the crystallites may be up to several μm. Such fillers are likewise referred to as nanoparticles. The particulate form of the fillers with small dimensions, moreover, is particularly advantageous for a transparent version of the PSA.

Through the construction of labyrinth-like structures by means of the fillers described above in the adhesive matrix, the diffusion pathway for, for example, oxygen and water vapor is extended in such a way that their permeation through the layer of adhesive is lessened. For improved dispersibility of these fillers in the binder matrix, these fillers may be surface-modified with organic compounds. The use of such fillers per se is known for example, from US 2007/0135552 A1 and from WO 02/026908 A1.

In another advantageous embodiment of the present invention use is also made of fillers which are able to interact in a particular way with oxygen and/or water vapor. Water vapor or oxygen penetrating into the (opto)electronic arrangement is then chemically or physically bound to these fillers. These fillers are also referred to as getters, scavengers, desiccants or absorbers. Such fillers include by way of example, but without restriction, the following: oxidizable metals, halides, salts, silicates, oxides, hydroxides, sulfates, sulfites, carbonates of metals and transition metals, perchlorates and activated carbon, including its modifications. Examples are cobalt chloride, calcium chloride, calcium bromide, lithium chloride, zinc chloride, zinc bromide, silicon dioxide (silica gel), aluminum oxide (activated aluminum), calcium sulfate, copper sulfate, sodium dithionite, sodium carbonate, magnesium carbonate, titanium dioxide, bentonite, montmorillonite, diatomaceous earth, zeolites and oxides of alkali metals and alkaline earth metals, such as barium oxide, calcium oxide, iron oxide and magnesium oxide, or else carbon nanotubes. Additionally it is also possible to use organic absorbers, examples being polyolefin copolymers, polyamide copolymers, PET copolyesters or other absorbers based on hybrid polymers, which are used generally in combination with catalysts such as cobalt, for example. Further organic absorbers are, for instance, polyacrylic acid with a low degree of crosslinking, ascorbates, glucose, gallic acid or unsaturated fats and oils.

In order to maximize the activity of the fillers in terms of the barrier effect, their fraction should not be too small. The fraction is preferably at least 5%, more preferably at least 10% and very preferably at least 15% by weight. Typically as high as possible a fraction of fillers is employed, without excessively lowering the bond strengths of the PSA or adversely affecting other properties. In one embodiment, therefore, the fraction is not more than 95%, preferably not more than 70% and more preferably not more than 50% by weight.

Also advantageous is a very fine division and very high surface area on the part of the fillers. This allows a greater efficiency and a higher loading capacity, and is achieved in particular using nanoscale fillers.

In contrast to laminations under atmospheric pressure, even uncrosslinked adhesives based on vinylaromatic block copolymers or else based on polyisobutylene, when bonded between two polyester films which additionally possess a barrier layer, do not exhibit blisters after storage at 85° C. and 85% rh.

In one preferred embodiment the volatile organic compounds (VOC) content of the hotmelt adhesive or PSA is not more than 50 μg of carbon per gram of adhesive, in particular not more than 10 μg C/g, measured in accordance with VDA 277. This has the advantage of better compatibility with the organic materials of the electronic construction and also with any functional layers present, such as a transparent layer of conductive metal oxide, such as indium-tin oxide, for example, or a similar layer of intrinsically conductive polymer. Moreover, the vacuum can be more easily produced when outgassing is low.

The hotmelt or PSA either may be used for the full-area bonding of electronic arrangements, or else, after appropriate converting, diecuts, rolls or other shapes may be produced from the PSA or the pressure-sensitive adhesive tape. Corresponding diecuts and shapes of the pressure-sensitive adhesive/tape are then preferably adhered to the substrate to be bonded, in the form, for instance, of edge surrounds or boundary of an electronic arrangement. The choice of the form of the diecut or shape is not restricted and is selected as a function of the type of electronic arrangement. The possibility of full-area lamination, in comparison to liquid adhesives, is advantageous for the barrier properties of the adhesive, through the increase in the permeation path length by lateral penetration of the permeants, since the permeation path length acts in inverse proportion to the permeation.

Where the adhesive is provided in the form of a sheetlike structure having a carrier, it is preferred for the thickness of the carrier to be preferably in the range from about 1 μm to about 350 μm, more preferably between about 4 μm and about 250 μm and very preferably between about 12 μm and about 150 μm. The optimum thickness depends on the electronic arrangement, on the end application and on the nature of the configuration of the PSA. Very thin carriers in the range from 1 to 12 μm are used with electronic constructions which are intended to reach a low overall thickness, but this increases the cost and complexity of integration into the construction. Very thick carriers between 150 and 350 μm are employed when the focus is on an increased permeation barrier through the carrier and the stiffness of the construction; the protective effect is increased by the carrier, whereas the flexibility of the construction is reduced. The preferred range between 12 and 150 μm represents an optimum compromise as an encapsulation solution for the majority of electronic constructions.

BRIEF DESCRIPTION OF THE DRAWINGS

Further details, objectives, features and advantages of the present invention are elucidated in more detail below with reference to preferred exemplary embodiments. In the figures.

Figure 1:
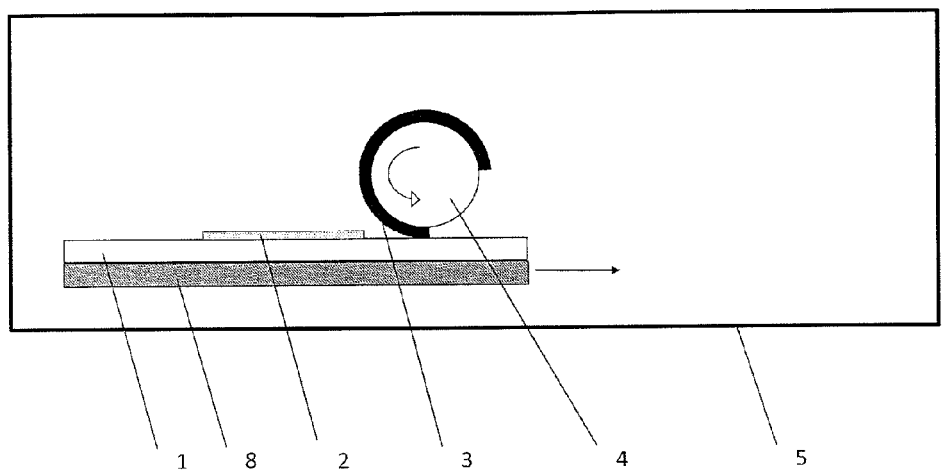
FIG. 1 shows the method of the invention embodied in a vacuum chamber.
Figure 2:
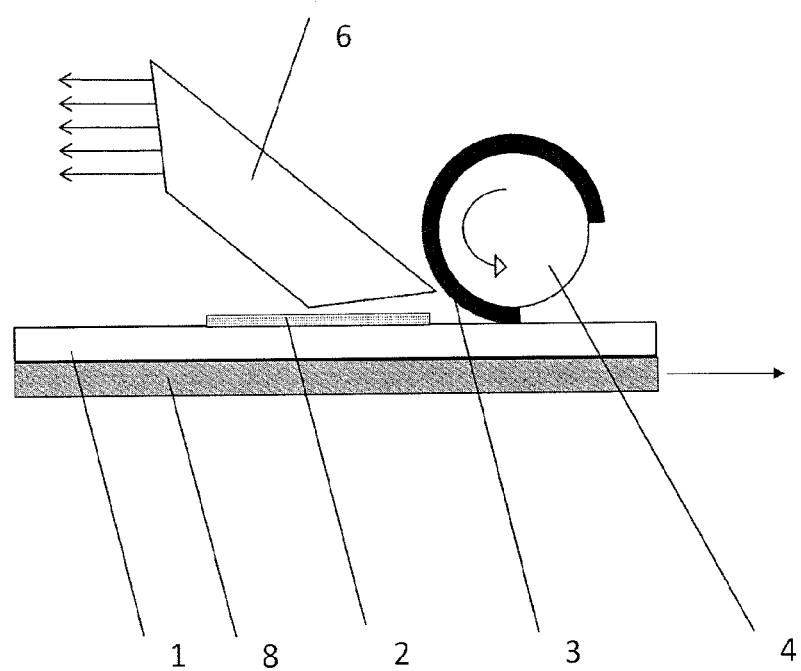
FIG. 2 shows the method of the invention with partial vacuum generation by means of a vacuum box.

The reference numerals in these figures have the following meaning:

1 substrate
2 electronic construction
3 sheetlike structure comprising hotmelt or PSA adhesive (adhesive tape)
4 laminating roll
41 second laminating roll 5 vacuum chamber
6 vacuum box
7 sealing rolls
8 substrate carrier
9 cover
21 glass plate
22 adhesive
23 calcium mirror
24 thin glass plate
25 adhesive transfer tape
26 PET film In all of the exemplary embodiments shown, the adhesive is applied in the form of an adhesive tape 3. This may in principle be a double-sided adhesive tape with a carrier, or an adhesive transfer tape. In the present context, an adhesive transfer tape embodiment is selected.

The thickness of the adhesive, present either as an adhesive transfer tape or coated onto a sheetlike structure, is preferably between about 1 μm and about 150 μm, more preferably between about 5 μm and about 75 μm, and very preferably between about 12 μm and 50 μm. High layer thicknesses of between 50 μm and 150 μm are used when the aim is to achieve enhanced adhesion to the substrate and/or a damping effect within the electronic construction. A disadvantage here, however, is the increased permeation cross section. Low layer thicknesses of between 1 μm and 12 μm reduce the permeation cross section, and hence the lateral permeation and the overall thickness of the electronic construction. However, there is a reduction of the adhesion to the substrate. Within the particularly preferred thickness ranges, there is a good tradeoff between a low thickness of adhesive and the consequent low permeation cross section, which reduces the permeation, and a sufficiently thick film of adhesive for producing a sufficiently adhering bond. The optimum thickness is dependent on the electronic construction, on the end application, on the configuration of the adhesive, and optionally on the sheetlike substrate.

In one preferred embodiment of the method, the electronic arrangement is produced on a substrate before the contacting with the sheetlike structure comprising the adhesive, in the vacuum, itself. Numerous production processes for electronics necessitate vacuum deposition or patterning techniques, in order, for example, to deposit or pattern electrodes or electrically active layers. One example of this are organic light-emitting diodes comprising so-called small molecules. An advantage here is that the pressure-sensitively adhesive sheetlike structure can be applied subsequently, ideally in a geometrically separate operating zone, in the same operational vacuum as the preceding steps, meaning that there can be no contamination, let alone functional impairment, of the surface of the electronic arrangement as a result of interim gas contact (for example, air, inert gas).

In one preferred version of the method, the electronic arrangement on a substrate is provided with a thin-film encapsulation prior to the contacting with the sheetlike structure comprising the adhesive. This method is generally carried out in a vacuum and is available for example from companies such as Vitex, USA. An advantage here is that the pressure-sensitively adhesive sheetlike structure can be applied in the same operational vacuum as the preceding steps and hence there can be no contamination of the surface as a result of interim gas contact (for example, air, inert gas).

Figure 4:
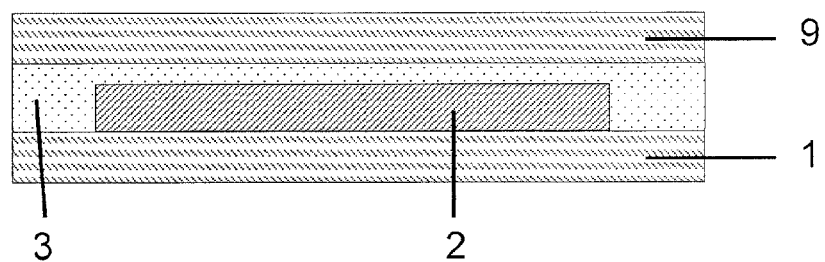
FIG. 4 shows an embodiment of an encapsulated (opto) electronic arrangement.

FIG. 4 shows an embodiment of an encapsulated electronic arrangement. Shown in turn is an electronic structure 2 which is disposed on a substrate 1 and is encapsulated from beneath by the substrate 1. Above and to the side of the electronic structure, the PSA 3 is disposed over the full area. At these locations, therefore, the electronic structure 2 is encapsulated by the PSA 3. A cover 9 is then applied to the PSA 3. This cover 9 need not necessarily comply with exacting barrier requirements, since the barrier is already provided by the PSA 3. For example, the cover 9 may merely take on a mechanical protection function, although it may additionally be provided as a permeation barrier.

In relation to FIG. 4 it is noted that the figures in the present case are schematic representations. From the representations it is in particular not apparent that the PSA 3 here and preferably in each case is applied with a homogeneous layer thickness. At the point of transition to the electronic structure, therefore, there is not a sharp edge, as the representation would suggest; instead, the transition is a fluid one, and there may instead be small unfilled or gas-filled regions remaining. Optionally, however, adaptation to the substrate is also possible, especially when application is carried out under vacuum. Moreover, the PSA is locally compressed to different extents, and so a certain evening-out of the difference in height at the edge structures is able to take place as a result of flow processes. The dimensions shown, as well, are not to scale, but instead serve only for improved representation. In particular, the electronic structure itself is generally relatively flat in form (often less than 1 μm thick).

EXAMPLES

Permeation

The permeability for oxygen (OTR) and water vapor (WVTR) were determined in accordance with DIN 53380 part 3 and ASTM F-1249, respectively. For this purpose, the adhesive was measured in a layer thickness of 50 μm without carrier material. For the oxygen permeability, measurement took place at 23° C. with a relative humidity of 50%. The water vapor permeability was determined at 37.5° C. with a relative humidity of 90%.

Lifetime Test

Figure 5:
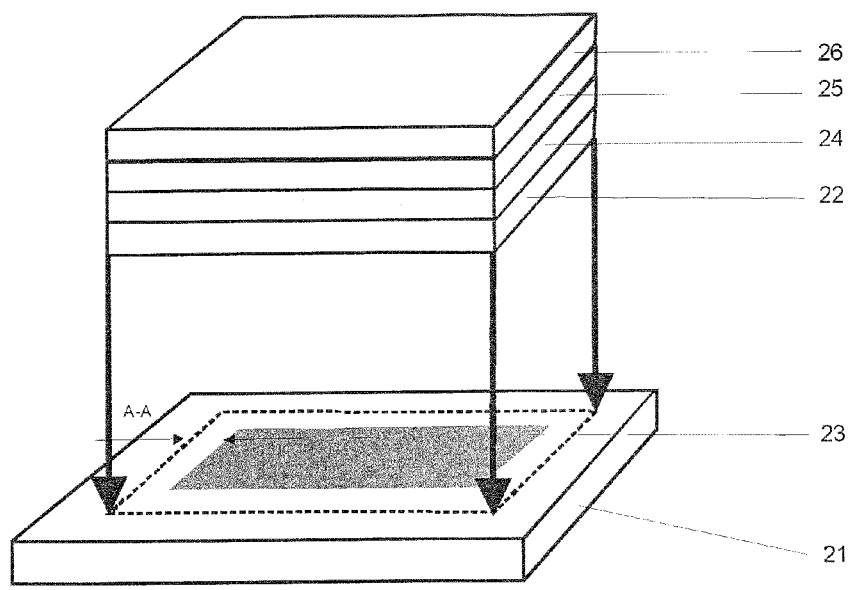
FIG. 5 shows a calcium test for determining the lifetime of an electronic construction.

As a measure for determining the lifetime of an electronic construction, a calcium test was employed. This is shown in FIG. 5. For this purpose, in a vacuum, a thin layer 23 of calcium, measuring 20×20 mm$^2$, was deposited onto a glass plate 21 and subsequently stored under a nitrogen atmosphere. The thickness of the calcium layer 23 is approximately 100 nm. The calcium layer 23 is encapsulated using an adhesive tape (26×26 mm$^2$) featuring the adhesive 22 under test, and also a thin glass sheet 24 (35 μm, Schott) as carrier material. For the purpose of stabilization, the thin glass sheet was laminated with a 100 μm PET film 26, using a 50 μm adhesive transfer tape 25 of a pressure-sensitive acrylate adhesive of high optical transparency. The adhesive 22 is applied to the glass plate 21 in such a way that the adhesive 22 covers the calcium mirror 23 with a margin protruding by 3 mm on all sides (A-A). As a result of the impervious glass carrier 24, only the permeation through the PSA is ascertained.

The test is based on the reaction of calcium with water vapor and oxygen, as described for example by A. G. Erlat et al. in "47$^{th}$ Annual Technical Conference Proceedings—Society of Vacuum Coaters", 2004, pages 654 to 659, and by M. E. Gross et al. in "46$^{th}$ Annual Technical Conference Proceedings—Society of Vacuum Coaters", 2003, pages 89 to 92. The light transmittance of the calcium layer is monitored, and increases as a result of its conversion into calcium hydroxide and calcium oxide. In the test set-up described, this takes place from the edge, and so there is a reduction in the visible area of the calcium mirror. The time taken for the area of the calcium mirror to halve is termed the lifetime. The measurement conditions selected are 60° C. and 90% relative humidity. The specimens were bonded in full-area form, without bubbles, with a PSA layer thickness of 25 μm. The measurement value (in h) was obtained as the average value from three individual measurements.

Blister Test

An adhesive transfer tape is bonded to a PET barrier film, provided with an inorganic barrier layer, having a thickness of 25 μm (WVTR=$8 \times 10^{-2}$ g/m²*d and OTR=$6 \times 10^{-2}$ cm³/m²*d*bar, in accordance with ASTM F-1249 and DIN 53380 part 3 and conditions stated above) and is laminated at room temperature (23° C.) in accordance with the method indicated below. The second side of the adhesive is then laminated with the same film, again as indicated below, with the siliconized PET film being removed beforehand. After a peel increase time of 24 hours, the prepared specimen is stored at 85° C. and 85% rh for 20 hours. The assembly is investigated for the appearance of blisters and, if so, for the time of their appearance, and a determination is made of the number of blisters per cm² and of their average size. The time taken for the first blisters to appear is recorded.

Bond Strength

The bond strength was determined as follows: The defined substrate used was a steel surface, a polyester surface (PET), and a polyethylene surface (PE). The bondable sheetlike element under investigation was cut to a width of 20 mm and a length of about 25 cm, provided with a handling section, and pressed immediately thereafter onto each of the selected substrates, using a 4 kg steel roller with a rate of advance of 10 m/min, five times. Immediately after that, the bondable sheetlike element was peeled from the substrate at an angle of 180°, using a tensile testing apparatus (from Zwick), and the force required to achieve this at room temperature was measured. The measurement value (in N/cm) was obtained as the average value from three individual measurements.

SAFT—Shear Adhesive Failure Temperature

This test is used for accelerated testing of the shear strength of adhesive tapes under a temperature load. It is performed by adhering the adhesive tape under investigation to a heatable steel plate, then loading it with a weight (50 g) and recording the shear travel.

Preparation of Test Samples

The adhesive tape under investigation is adhered to an aluminum foil 50 μm thick. The adhesive tape thus prepared is cut to a size of 10 mm×50 mm.

The cut-to-size adhesive tape sample is bonded to a polished steel test plate (material 1.4301, DIN EN 10088-2, surface 2R, surface roughness $R_a$ 30 to 60 nm, dimensions 50 mm×13 mm×1.5 mm), cleaned with acetone, in such a way that the bond area of the sample is height×width=13 mm×10 mm and the steel test plate overhangs at the upper edge by 2 mm. This assembly is then fixed by crossing a 2 kg steel roller over it six times with a speed of 10 m/min. At the top, the sample is reinforced flush with a stable adhesive strip, which serves as a support for the travel sensor. The sample is then suspended by means of the steel plate, in such a way that the longer protruding end of the adhesive tape points vertically downward.

Measurement:

The sample to be measured is loaded at the bottom end with a 50 g weight. Beginning at 25° C., the steel test plate with the bonded sample is heated at a rate of 9° C. per minute to the final temperature of 200° C.

Using the travel sensor, observations are made of the slip travel of the sample as a function of temperature and time. The maximum slip travel is set at 1000 μm (1 mm), and if this is exceeded the test is discontinued and the temperature obtained to that point is reported as the test result. The relative atmospheric humidity is 50±5%.

Molecular Weight Determination

The weight-average molecular weight $M_w$ is determined by means of gel permeation chromatography (GPC). The eluent used is THF with 0.1% by volume of trifluoroacetic acid. Measurement takes place at 25° C. The preliminary column used is PSS-SDV, 5μ, $10^3$ Å, ID 8.0 mm×50 mm. Separation takes place using the columns PSS-SDV, 5μ, $10^3$ and also $10^5$ and $10^6$ each with an ID of 8.0 mm×300 mm. The sample concentration is 4 g/l, the flow rate 1.0 ml per minute. Measurement takes place against PMMA standards. (μ=μm; 1 Å=$10^{-10}$ m).

Production of the Specimens

The adhesives in examples 1 to 5 were prepared from solution. For this purpose the individual constituents were dissolved in toluene (solids fraction 40%) and the solution was coated onto a siliconized PET film 50 μm thick, this coating being dried at 120° C. for 15 minutes, to give an adhesive layer having a weight per unit area of 25 or 50 g/m².

PSA 1

| 50 parts | Kraton FG 1924 | maleic anhydride-modified SEBS with 13% by weight block polystyrene content, 36% by weight diblock, and 1% by weight maleic acid, from Kraton |
|---|---|---|
| 50 parts | Kraton FG 1901 | maleic anhydride-modified SEBS with 30% by weight block polystyrene content, without diblock and with 1.7% by weight maleic acid, from Kraton |
| 70 parts | Escorez 5615 | hydrogenated HC resin with a softening point of 115° C., from Exxon |
| 25 parts | Ondina 917 | white oil comprising paraffinic and naphthenic fractions, from Shell |
| 1 part | aluminum acetylacetonate | |

PSA 2

| 100 parts | Tuftec P 1500 | SBBS with 30% by weight block polystyrene content, from Asahi. The SBBS has a diblock content of around 68% by weight. |
|---|---|---|
| 100 parts | Escorez 5600 | hydrogenated HC resin having a softening point of 100° C., from Exxon |

-continued

| 25 parts | Ondina 917 | white oil comprising paraffinic and naphthenic fractions, from Shell |

Hotmelt adhesive 3

| 100 parts | Kraton FG 1924 | maleic anhydride-modified SEBS with 13% by weight block polystyrene content, 36% by weight diblock, and 1% by weight maleic acid, from Kraton |
| 25 parts | Escorez 5600 | hydrogenated HC resin (hydrocarbon resin) with a softening point of 100° C., from Exxon |
| 1 part | aluminum acetylacetonate | |

PSA 4

| 100 parts | SiBStar 103T | triblock SiBS with 30% by weight block polystyrene content, from Kaneka |
| 40 parts | SiBStar 042D | diblock SiB with 15% by weight block polystyrene content, from Kaneka |
| 120 parts | Escorez 5600 | hydrogenated HC resin having a softening point of 100° C., from Exxon |

PSA 5

| 100 parts | Oppanol B10 | polyisobutylene having an average molecular weight $M_w$ of 40 000 g/mol |
| 70 parts | Oppanol B150 | polyisobutylene having an average molecular weight $M_w$ of >800 000 g/mol |
| 100 parts | Escorez 5600 | hydrogenated HC resin having a softening point of 100° C., from Exxon |

Results:

For adhesives assessment of the examples identified above, first of all the bond strength and the SAFT tests were carried out.

TABLE 1

| | Bond strength [N/cm] Steel/PET/PE | SAFT [° C.] |
| --- | --- | --- |
| Adhesive 1 | 5.8/4.1/3.2 | 200 |
| Adhesive 2 | 7.3/6.2/5.7 | 98 |
| Adhesive 3 | 4.2/3.7 | 200 |
| Adhesive 4 | 5.5/4.9/4.2 | 94 |
| Adhesive 5 | 7.5/7.0/4.9 | 63 |

As can be seen, high bond strengths to all substrates were obtained in all examples, and excellent resistance at elevated temperatures was achieved for the two examples 1 and 3.

The results of the permeation measurements can be found in table 2.

TABLE 2

| | WVTR g/($m^2$*day) | OTR g/($m^2$*day*bar) |
| --- | --- | --- |
| Adhesive 1 | 22 | 3120 |
| Adhesive 2 | 33 | 8500 |
| Adhesive 3 | 25 | 5550 |
| Adhesive 4 | 8 | 2100 |
| Adhesive 5 | 11 | 2600 |

As can be seen, the barrier effect of the adhesives is in the range of low permeation rates, so making these adhesives particularly suitable for the encapsulation of electronic constructions.

Lamination Tests

Examples 1, 2, 4 and 5

Lamination was performed with a method as represented in FIG. 1, at a pressure of 50 mbar and at room temperature, in a vacuum chamber. For this purpose, the apparatus shown in FIG. 1, comprising an elastomer-clad roll (Shore A hardness 40), was introduced into the vacuum chamber. Beforehand, a sheetlike structure produced in accordance with the test method and cut to size, and bearing the adhesive, was affixed to the laminating roll and at the edge was contacted with the substrate, which was fastened to the substrate carrier by means of a double-sided adhesive tape. When the vacuum had been produced, the laminating roll was rotated through a rotation passage, and, owing to the adhesion of the PSA to the substrate, the substrate carrier together with the substrate was pulled through beneath the laminating roll, thus producing the laminate with a laminating force of 20 N/cm.

Example 3

Lamination was carried out at a temperature of 100° C. in a vacuum heating press from Laufer at a pressure of approximately 1 MPa. The hotmelt-adhesive sheetlike structure, cut to size and produced in accordance with the test method, was arranged by means of a compressible spacer at a distance of around 3 mm above the substrate, and, only after the vacuum had been produced, the sheetlike structure was contacted with the substrate by the closing of the press, with a residual pressure of 50 mbar. The construction with the calcium mirror was produced correspondingly under inert gas and introduced into the vacuum press in a container which can be deformed by the press. The container opened automatically as a result of the overpressure of the inert gas present, when the outer vacuum was produced. The inert gas was then removed with the vacuum drawing. The inert gas container and the spacers were designed so as not to hinder lamination.

Examples 6 to 9

Figure 3:
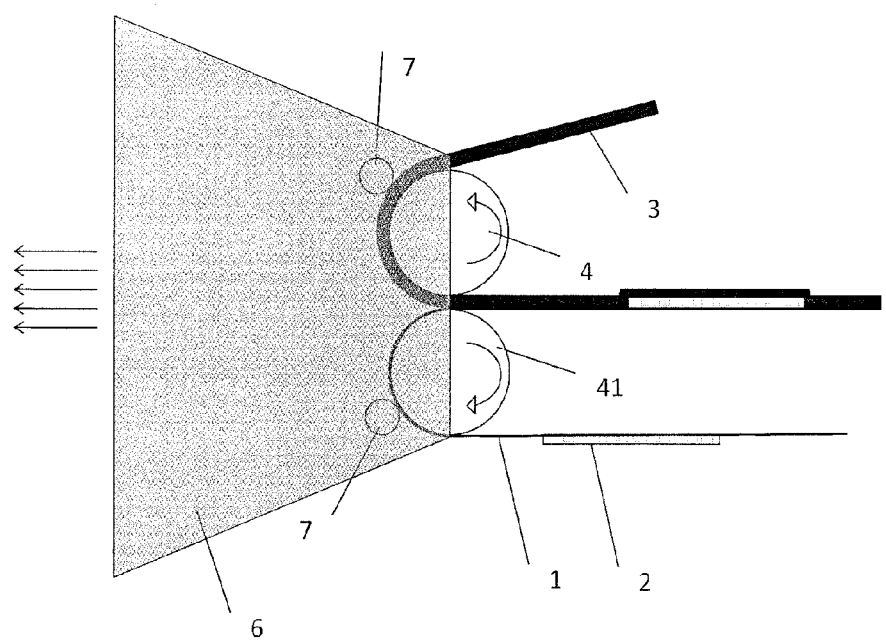
FIG. 3 shows the method of the invention employed in a continuous variant, the vacuum being generated partially with an apparatus likewise of the invention.

Lamination was performed by a method as shown in FIG. 3, at a pressure of 550 mbar in the vacuum box and with a laminating force of around 40 N/cm (Shore A hardness of roll: 40). The apparatus represented schematically in FIG. 3 was placed, for the production of the specimens for the lifetime test, in a nitrogen-filled glovebox, the outgoing gas stream from the vacuum pump being passed into the glovebox in order to prevent the development of underpressure there. For the production of laminates for the further investigations, the apparatus was operated in the air atmosphere. The substrates and also the sheetlike structures comprising the PSA were supplied in the form of cut-to-size sections.

Comparative Examples 1, 2, 4 and 5

Lamination was carried out with the above-described apparatus in line with FIG. 1 at room temperature in a glovebox under a nitrogen atmosphere or in ambient air and at atmospheric pressure (approximately 1.013 bar). Beforehand, a sheetlike structure cut to size, and bearing the adhesive, was affixed to the laminating roll and was contacted with the substrate, which was fastened to the substrate carrier by means of a double-sided adhesive tape. The laminating roll was rotated, and, owing to the adhesion of the PSA to the substrate, the substrate carrier together with the substrate was pulled through beneath the laminating roll, thus producing the laminate with a laminating force of 20 N/cm.

Comparative Example 3

Lamination was carried out at a temperature of 100° C. in a vacuum heating press from Laufer at a pressure of approximately 1 MPa. The hotmelt-adhesive sheetlike structure, cut to size and produced in accordance with the test method, was arranged by means of a compressible spacer at a distance of around 3 mm above the substrate, and, at atmospheric pressure, the sheetlike structure was contacted with the substrate by the closing of the press. The construction with the calcium mirror was produced correspondingly under inert gas and introduced into the heating press in a container which can be deformed by the press. The container opened automatically as a result of the overpressure when the container was compressed during the closing of the press, causing establishment of atmospheric pressure on the test body even prior to the contacting.

Results of the lifetime and blister tests:

TABLE 3

|  | Adhesive | Lamination method | Lifetime [h] | Blister test [time in h] |
| --- | --- | --- | --- | --- |
| Example 1 | 1 | Vacuum chamber | 490 | No blisters after 14 days |
| Example 2 | 2 | Vacuum chamber | 185 | No blisters after 14 days |
| Example 3 | 3 | Vacuum chamber | 480 | No blisters after 14 days |
| Example 4 | 4 | Vacuum chamber | 505 | No blisters after 14 days |
| Example 5 | 5 | Vacuum chamber | 520 | First blisters after 24 h |
| Example 6 | 1 | Vacuum box | 375 | No blisters after 14 days |
| Example 7 | 2 | Vacuum box | 160 | No blisters after 14 days |
| Example 8 | 4 | Vacuum box | 390 | First blisters after 10 h |
| Example 9 | 5 | Vacuum box | 410 | First blisters after 2 h |
| Comparative example 1 | 1 | Standard pressure | 350 | No blisters after 14 days |
| Comparative example 2 | 2 | Standard pressure | 140 | First blisters after 2 h |
| Comparative example 3 | 3 | Standard pressure | 420 | No blisters after 14 days |
| Comparative example 4 | 4 | Standard pressure | 385 | First blisters after 2 h |
| Comparative example 5 | 5 | Standard pressure | 365 | First blisters after 1 h |

The lifetime tests witness a significant extension to the lifetime by virtue of the method of the invention, as shown by the comparison of example 1 with comparative example 1, example 2 with comparative example 2, and so on. This is explained by the improved wetting of the surface by the adhesive. As a result, fewer microbubbles are included and hence the permeation pathway at the interface becomes closer.

A distinct improvement is apparent in the blister test. Some of the comparative compositions no longer exhibit any blistering at all within 14 days, while with others the time before first blistering is extended. This is likewise attributed to the reduction of microbubbles at the interface, that serve as nuclei for further blistering.

The invention claimed is:

1. A method for encapsulating an electronic arrangement against permeants, in which an electronic arrangement is provided on a substrate, said method comprising:
    a) providing a first web material comprising the electronic arrangement on the substrate, optionally in the form of a multiplicity of individual electronic arrangements,
    b) providing a second web material comprising an adhesive sheet-like structure, optionally as a continuous area or individual sheetlike diecuts disposed on a carrier,
    c) providing an apparatus comprising (i) a vacuum chamber and (ii) a pair of rolls together forming a roll nip and at the same time sealing off the vacuum chamber,
    d) passing the two web materials into the roll nip and into the vacuum chamber via the pair of rolls,
    e) laminating the adhesive sheetlike structure with the electronic arrangement to form a resultant laminate in a vacuum in the roll nip, and
    f) leading the resultant laminate away from the vacuum chamber through the roll nip of the pair of rolls.

2. The method of claim 1, wherein the adhesive is a pressure-sensitive adhesive.

3. The method of claim 1, wherein the adhesive is a hotmelt adhesive.

4. The method of claim 1, wherein the vacuum is a reduced ambient pressure of not more than or equal to 800 mbar.

5. The method of claim 1, wherein the vacuum is produced partially on the electronic arrangement and/or on the substrate.

6. The method of claim 1, wherein the method is combined with other vacuum techniques which are used for producing electronic assemblies.

7. The method of claim 1, wherein the electronic arrangement is provided with a thin film encapsulation prior to the laminating.

8. The method of claim 1, wherein the vacuum is generated by raising the geographical height of the site of lamination.

9. An apparatus for encapsulating an electronic arrangement against permeants, said apparatus comprising:
    a) a first web material comprising the electronic arrangement on a substrate, optionally in the form of a multiplicity of individual electronic arrangements,
    b) a second web material comprising a pressure-sensitive adhesive or hotmelt-adhesive sheetlike structure, optionally as a continuous area or individual sheetlike diecuts disposed on a carrier substrate,
    c) a vacuum chamber, and
    d) a pair of rolls together forming a roll nip and sealing off the vacuum chamber,
wherein the apparatus is configured so that when the two web materials are passed into the vacuum chamber via the pair of rolls together forming the roll nip, said chamber is sealed off at the same time by the rolls, the two web materials are passed into the roll nip via the pair of rolls, and lamination of the pressure-sensitive adhesive or hotmelt-adhesive sheetlike structure with the electronic arrangement on the substrate to form a resultant laminate takes place in a vacuum in said roll nip, and the resultant laminate is led from the vacuum chamber through the roll nip of the pair of rolls.

10. The apparatus of claim 9, wherein the rolls are manufactured from an elastomer or are provided with an elastomer covering, and so the rolls on their surface at room temperature have a Shore A hardness of less than 50.

* * * * *